United States Patent
Yang et al.

(10) Patent No.: US 12,132,012 B2
(45) Date of Patent: Oct. 29, 2024

(54) SEMICONDUCTOR DEVICE AND MANUFACTURING METHOD THEREOF

(71) Applicant: CHANGXIN MEMORY TECHNOLOGIES, INC., Hefei (CN)

(72) Inventors: Nianwang Yang, Hefei (CN); Hsin-Pin Huang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 421 days.

(21) Appl. No.: 17/455,972

(22) Filed: Nov. 22, 2021

(65) Prior Publication Data

US 2022/0130775 A1    Apr. 28, 2022

Related U.S. Application Data

(63) Continuation of application No. PCT/CN2021/104759, filed on Jul. 6, 2021.

(30) Foreign Application Priority Data

Oct. 28, 2020   (CN) .......................... 202011170771.7

(51) Int. Cl.
*H01L 23/58* (2006.01)
*H01L 21/74* (2006.01)
*H01L 23/00* (2006.01)

(52) U.S. Cl.
CPC ............ *H01L 23/585* (2013.01); *H01L 21/74* (2013.01); *H01L 23/562* (2013.01); *H01L 23/564* (2013.01)

(58) Field of Classification Search
CPC ..... H01L 23/585; H01L 21/74; H01L 23/562; H01L 23/564
USPC ........................................................ 257/620
See application file for complete search history.

(56) References Cited

U.S. PATENT DOCUMENTS

| 5,834,829 A | 11/1998 | Dinkel et al. |
| 6,492,716 B1 | 12/2002 | Bothra et al. |
| 6,853,067 B1 * | 2/2005 | Cohn ..................... H01L 24/81 257/E21.511 |
| 8,530,997 B1 * | 9/2013 | Yang .................. H01L 21/4814 438/618 |
| 9,449,929 B2 | 9/2016 | Saito et al. |
| 9,679,896 B2 * | 6/2017 | Yoon ..................... H01L 23/585 |
| 2005/0087878 A1 | 4/2005 | Uesugi et al. |

(Continued)

FOREIGN PATENT DOCUMENTS

| CN | 1753169 A | 3/2006 |
| CN | 102315247 A | 1/2012 |
| CN | 108493162 A | 9/2018 |

(Continued)

OTHER PUBLICATIONS

International Search Report as cited in PCT Application No. PCT/CN2021/104759 mailed Oct. 11, 2021, 5 pages.

*Primary Examiner* — Caleen O Sullivan
(74) *Attorney, Agent, or Firm* — Syncoda LLC; Feng Ma

(57) ABSTRACT

Embodiments of the present application provide a semiconductor device and a manufacturing method thereof. The semiconductor device includes a semiconductor substrate; an integrated circuit region formed in the semiconductor substrate; and a seal ring arranged in the semiconductor substrate and around the integrated circuit region and configured to protect the integrated circuit region, wherein the seal ring has a wavy structure.

11 Claims, 6 Drawing Sheets

(56) References Cited

U.S. PATENT DOCUMENTS

2005/0179213 A1\* 8/2005 Huang ................. H01L 23/564
277/620

FOREIGN PATENT DOCUMENTS

| CN | 110875256 | A | 3/2020 |
|----|-----------|---|--------|
| TW | 1686905 | B | 3/2020 |

\* cited by examiner

SEMICONDUCTOR DEVICE AND MANUFACTURING METHOD THEREOF

CROSS-REFERENCE TO RELATED APPLICATIONS

This application is a continuation application of International Patent Application No. PCT/CN2021/104759, filed on Jul. 6, 2021, which claims priority to Chinese Patent Application No. 202011170771.7, filed with the Chinese Patent Office on Oct. 28, 2020 and entitled "SEMICONDUCTOR DEVICE AND MANUFACTURING METHOD THEREOF." International Patent Application No. PCT/CN2021/104759 and Chinese Patent Application No. 202011170771.7 are incorporated herein by reference in their entireties.

TECHNICAL FIELD

The present application relates to the field of semiconductor technologies, and in particular, to a semiconductor device and a manufacturing method thereof.

BACKGROUND

A semiconductor integrated circuit industry has undergone rapid growth. As a semiconductor device constantly decreases in size, there is an increasing demand for a seal ring on a periphery of a chip to prevent entry of moisture and ions into the chip and prevent propagation of cracks into the chip. However, the seal ring in a prior art does not have an ideal protective effect.

SUMMARY

A seal ring in a semiconductor device and a manufacturing method thereof according to embodiments of the present application have better protective effects.

The embodiments of the present application provide a semiconductor device, including: a semiconductor substrate; an integrated circuit region formed in the semiconductor substrate; and a seal ring arranged in the semiconductor substrate and around the integrated circuit region and configured to protect the integrated circuit region, wherein the seal ring has a wavy structure.

The embodiments of the present application provide a semiconductor device manufacturing method, including the following steps:

providing a semiconductor substrate having an integrated circuit region; forming a trench on the semiconductor substrate, the trench being arranged around the integrated circuit region; and forming a seal ring in the trench, the seal ring having a wavy structure.

BRIEF DESCRIPTION OF DRAWINGS

The above and other features and advantages of the present application will become more apparent through detailed descriptions of exemplary implementations thereof with reference to the accompanying drawings.

FIG. 7 to FIG. 13 are sectional views of different process stages of a semiconductor device manufacturing method according to an embodiment of the present application, wherein FIG. 7 to FIG. 11 are sectional views taken along A-A in FIG. 2, and FIG. 12 and FIG. 13 are sectional views taken along B-B in FIG. 5.

REFERENCE NUMERALS

Figure 1:
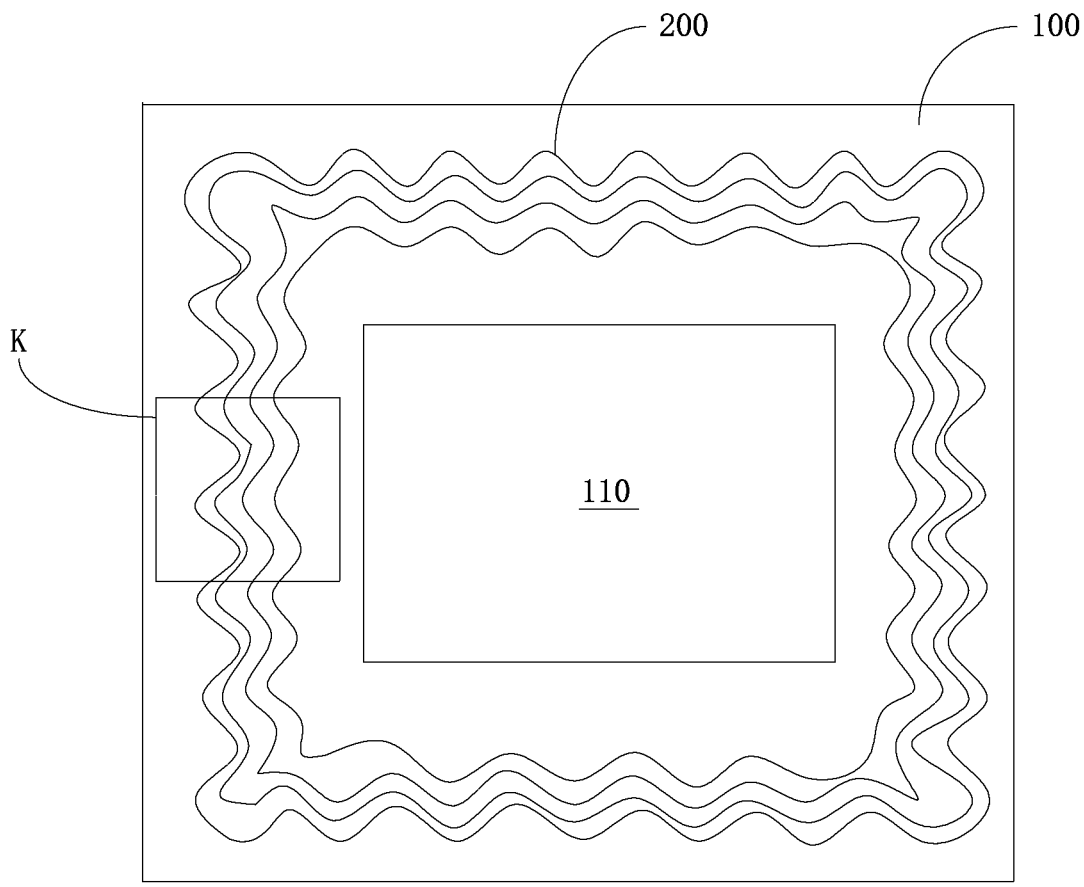
FIG. 1 is a sectional view of a semiconductor device according to an embodiment of the present application.

100 semiconductor substrate, 110 integrated circuit region,
120 trench, 200 seal ring,
201 space, 210 finger,
211 arc-shaped surface, 220 crest portions,
230 trough portions, 300 mask layer,
400 barrier layer, 500 metal layer

DESCRIPTION OF EMBODIMENTS

Exemplary implementations are now described more comprehensively with reference to the accompanying drawings. However, the exemplary implementations can be implemented in a variety of forms, and should not be understood as being limited to the implementations described herein. Rather, the implementations are provided to enable the present application to be comprehensive and complete and to fully convey the conception of the exemplary implementations to those skilled in the art. Same reference numerals in the drawings indicate same or similar structures, and thus their detailed descriptions will be omitted.

A semiconductor device is generally provided with a seal ring that extends around a periphery of an integrated circuit region of the semiconductor device. The seal ring is generally a continuous ring of one or more metal layers. In one or more exemplary embodiments, the seal ring may have one or more of the following functions: providing protection to prevent entry of external moisture into an integrated circuit component formed in the semiconductor device; providing protection to prevent intrusion of ions into the integrated circuit component formed in a substrate, and providing a protection structure to prevent propagation of cracks in the substrate into a region where the integrated circuit component in the seal ring is located.

The embodiments of the present application may be applied to any suitable semiconductor device using a seal ring, for example, a complementary metal oxide semiconductor field-effect transistor, a complementary metal oxide semiconductor device, a p-type metal oxide semiconductor device, an n-type metal oxide semiconductor device, a fin field-effect transistor, a gate-all-around metal oxide semiconductor field-effect transistor such as a nanowire device or nanosheet device, or other multi-gate field-effect transistors. The semiconductor device may be manufactured during processing of an integrated circuit or a part thereof (which may include a static random access memory and/or a logic circuit, a passive member such as a resistor, a capacitor, or an inductor, and an active member such as a p-type field-effect transistor, an n-type field-effect transistor, a fin field-effect transistor, a complementary metal oxide semiconductor field-effect transistor, a complementary metal oxide semiconductor transistor, a bipolar transistor, a high-voltage transistor, a high-frequency transistor and other memory cells, or combinations thereof).

As shown in FIG. 1, FIG. 1 is a sectional view of a semiconductor device according to an embodiment of the present application. The semiconductor device according to the embodiment of the present application includes a semiconductor substrate 100, an integrated circuit region 110 formed in the semiconductor substrate 100 and a plurality of seal rings 200. The plurality of seal rings 200 are arranged in the semiconductor substrate 100 and around the integrated circuit region 110 and configured to protect the integrated circuit region 110. The seal ring 200 has a wavy structure.

The integrated circuit region 110 may be provided with one or more active devices (such as a transistor, a diode and a photodiode), one or more passive devices (such as a resistor, a capacitor and an inductor), or combinations thereof.

The plurality of seal rings 200 are arranged around the integrated circuit region 110 and implements at least one of the following functions: preventing entry of moisture into an integrated circuit element formed in the substrate of the integrated circuit region 110, preventing entry of ions into the integrated circuit element formed in the substrate and preventing propagation of cracks in the substrate into an internal region of the seal ring 200 where the integrated circuit element is located.

Compared with the shape of the seal ring in the prior art, the seal ring 200 according to the embodiment of the present application has a wavy structure. The wavy structure enables a surface of the seal ring 200 facing the integrated circuit region 110 and a surface facing away from the integrated circuit region 110 to be arc-shaped. The arc-shaped surface has a larger interception area than a plane, so that the seal ring 200 according to the embodiment of the present application can more effectively prevent entry of moisture and ions into the integrated circuit region 110 and prevent propagation of cracks into the integrated circuit region 110, which significantly improves a protective effect of the seal ring 200.

Figure 2:
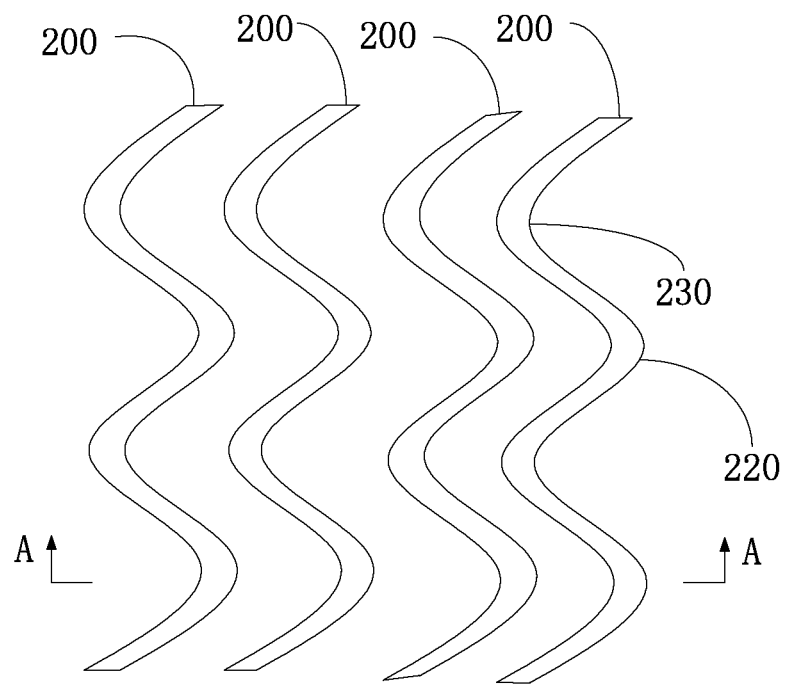
FIG. 2 is a partial enlarged view of a first embodiment at K in FIG. 1.

As shown in FIG. 2, FIG. 2 is a partial enlarged view of a first embodiment at K in FIG. 1. The semiconductor device according to the embodiment of the present application includes four seal rings 200 sequentially arranged around the integrated circuit region 110.

The seal ring 200 according to the embodiment of the present application includes a plurality of crest portions 220 and a plurality of trough portions 230. The plurality of crest portions 220 and the plurality of trough portions 230 are arranged alternately. Each crest portion 220 is convex towards a direction facing the integrated circuit region 110, and each trough portion 230 is convex towards a direction facing away from the integrated circuit region 110. The plurality of crest portions 220 have a same curvature, and the plurality of trough portions 230 have a same curvature. Each crest portions 220 has a same curvature as each trough portion 230.

The plurality of crest portions 220 and the plurality of trough portions 230 of the seal ring 200 are designed to be the same in shape and curvature, so that interception areas of each crest portion 220 and each trough portion 230 of each seal ring 200 are roughly the same and uniform, so as to prevent a difference in structural strength caused by an abrupt change due to inconsistency of interception areas and prevent final damages at the abrupt change. In addition, the seal rings 200 are of a same structure, uniform and easy to process.

Certainly, it may be understood that the plurality of crest portions 220 and the plurality of trough portions 230 of the seal ring 200 may also adopt following variation structures. For example, Curvatures between the plurality of crest portions 220 on one seal ring 200 may be different, and curvatures between the plurality of trough portions 230 on one seal ring 200 may be different; or curvatures between the plurality of crest portions 220 on one seal ring 200 are the same, and the curvature of the crest portion 220 is different from that of the trough portion 230.

Certainly, the seal ring 200 may be at least partially a wavy structure.

As shown in FIG. 2, the semiconductor device according to the embodiment of the present application includes four seal rings 200. The four seal rings 200 may be equally or unequally spaced from one another.

Certainly, it is to be understood that a number of the seal ring 200 according to the embodiment of the present application is not limited to four, which may also be, for example, one, two, three, more than five, and so on.

In two adjacent seal rings 200, the plurality of crest portions 220 of one seal ring 200 are arranged correspondingly to the plurality of trough portions 230 of the other seal ring 200. In the two adjacent seal rings 200, the plurality of trough portions 230 of one seal ring 200 are arranged correspondingly to the plurality of trough portions 230 of the other seal ring 200.

With the above design that the plurality of crest portions 220 of one seal ring 200 are arranged correspondingly to the plurality of trough portions 230 of the other seal ring 200 and the plurality of trough portions 230 of one seal ring 200 are arranged correspondingly to the plurality of trough portions 230 of the other seal ring 200, more space can be saved in a case where the plurality of seal rings 200 are arranged side by side, thereby helping reduce a size of the semiconductor device.

Figure 3:
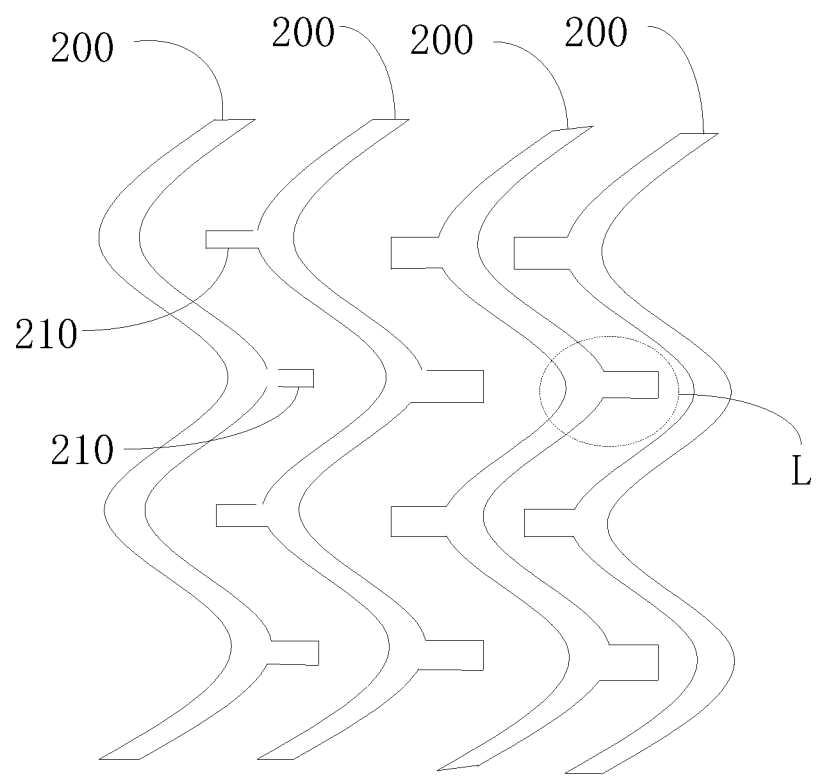
FIG. 3 is a partial enlarged view of a second embodiment at K in FIG. 1.

As shown in FIG. 3, FIG. 3 is a partial enlarged view of a second embodiment at K in FIG. 1. In the embodiment of the present application, in two adjacent seal rings 200, one seal ring 200 includes a plurality of fingers 210, and the finger 210 extends towards a direction of the other seal ring 200 and is not connected to the other seal ring 200.

The plurality of fingers 210 on one seal ring 200 may be the same as the crest portions 220 in number. The plurality of fingers 210 may be arranged at vertices of the plurality of crest portions 220 respectively. With the design of the finger 210, an interception area of the seal ring 200 can be further increased, which helps improve the protective effect of the seal ring 200.

Certainly, it may be understood that the plurality of fingers 210 may not be arranged at the vertices of the plurality of crest portions 220, but arranged in other regions of the crest portion 220; or the plurality of fingers 21 are arranged at bottom points of the plurality of trough portions 230 respectively; or the plurality of fingers 21 are arranged at other regions of the plurality of trough portions 230 except for the bottom points.

Figure 4:
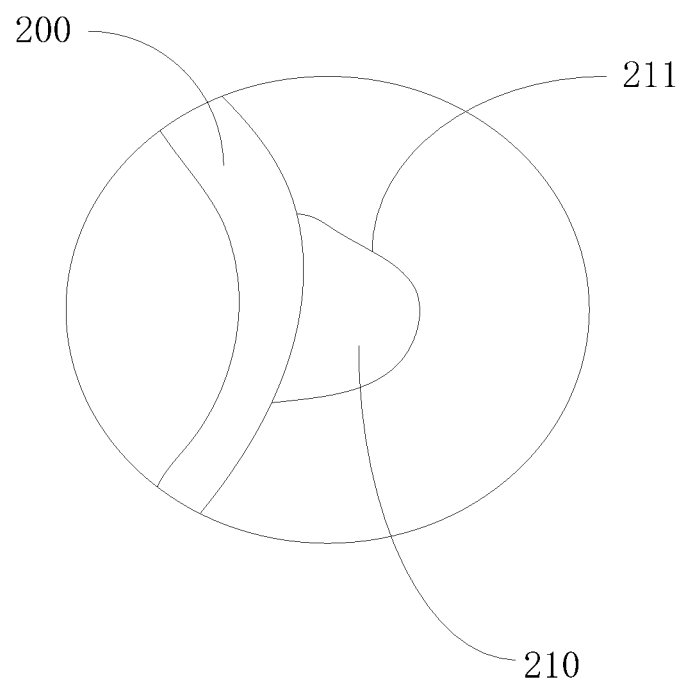
FIG. 4 is a partial enlarged view of an implementation of a finger at L in FIG. 3.

As shown in FIG. 4, FIG. 4 is a partial enlarged view of an implementation of a finger 210 at L in FIG. 3. The finger 210 according to the embodiment of the present application has an arc-shaped surface 211. The arc-shaped surface 211 faces the other seal ring 200. Since a surface area of the arc-shaped surface 211 is larger than that of a plane, the interception area of the seal ring 200 is further increased, which further improves the protective effect of the seal ring 200.

Certainly, in other implementations, the finger 210 may also have a surface in other shapes.

Figure 5:
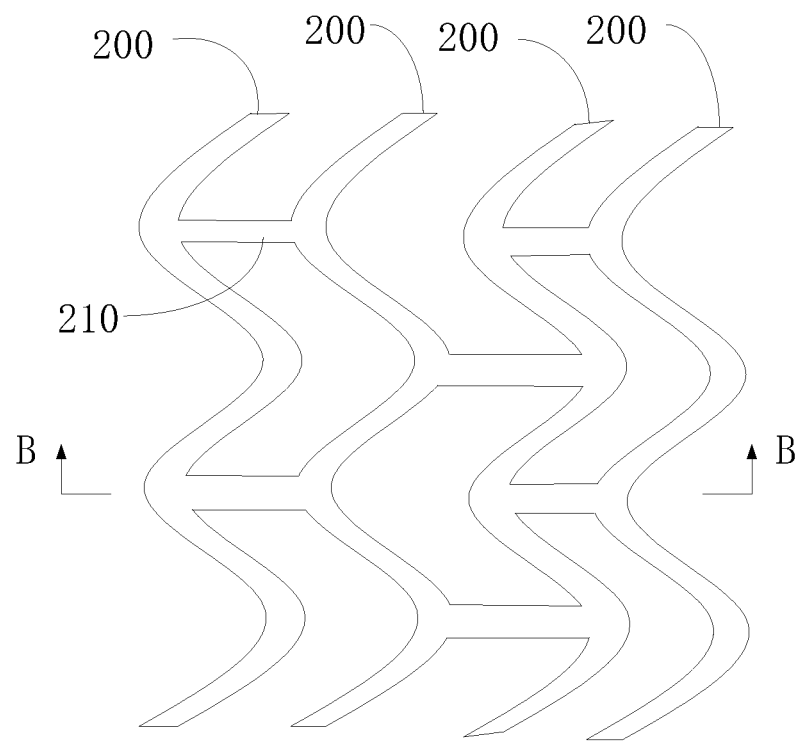
FIG. 5 is a partial enlarged view of a third embodiment at K in FIG. 1.

As shown in FIG. 5, FIG. 5 is a partial enlarged view of a third embodiment at K in FIG. 1. In the embodiment of the present application, two adjacent seal rings 200 are connected through a plurality of fingers 210. The plurality of fingers 210 between the two adjacent seal rings 200 are spaced around the integrated circuit region 110.

With the design that two adjacent seal rings 200 are connected through a plurality of fingers 210, the plurality of seal rings 200 are not arranged separately, but form a network structure. The seal ring 200 of the network structure is more stable and has a better protective effect.

Figure 6:
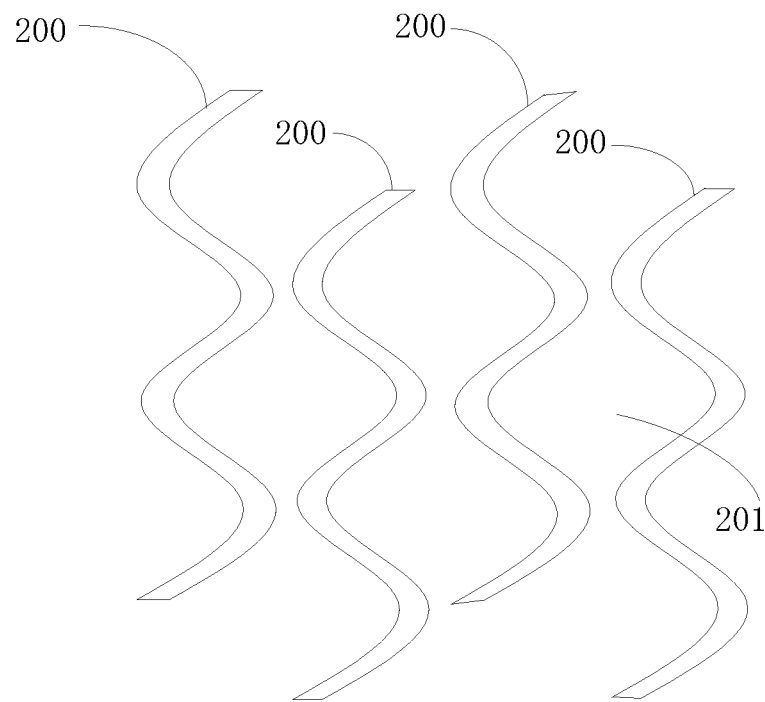
FIG. 6 is a partial enlarged view of a fourth embodiment at K in FIG. 1.

As shown in FIG. 6, FIG. 6 is a partial enlarged view of a fourth embodiment at K in FIG. 1. In the embodiment of the present application, in two adjacent seal rings 200, the plurality of crest portions 220 of one seal ring 200 are arranged correspondingly to the plurality of trough portions 230 of the other seal ring 200. In the two adjacent seal rings 200, the plurality of trough portions 230 of one seal ring 200 are arranged correspondingly to the plurality of crest portions 220 of the other seal ring 200.

In this way, the crest portions 220 and the trough portions 230 are arranged alternately along a cross section perpendicular to the plurality of seal rings 200. When cracks propagate into the integrated circuit region 110, a space 201 between the crest portions 220 of one seal ring 200 and the trough portions 230 of the other seal ring 200 becomes larger since convex surfaces of the crest portions 220 and concave surfaces of the trough portions 230 are alternately arranged. When propagating inward, the cracks have to pass through the crest portion 220/the space 201/the trough portion 230/the crest portion 220/the space 201, etc. Such a structural design is more conducive to preventing inward propagation of cracks, ions or moisture.

Certainly, it may be understood that the two adjacent seal rings 200 may also be misaligned in addition to the above manner in which the crest portions 220 are arranged correspondingly to the trough portions 230; for example, one seal ring 200 and the other seal ring 200 adjacent thereto are misaligned up and down by a particular distance.

In addition, it may be further understood that a plurality of fingers 210 may be further provided in the embodiment shown in FIG. 6. The finger 210 may extend from one seal ring 200 to the other seal ring 200 and is not connected to the other seal ring 200; that is, the finger 210 is connected to two adjacent seal rings 200. The structure and advantages of the finger 210 are the same as those in the embodiments shown in FIG. 4 and FIG. 6, which are not described in detail herein.

Figure 12:
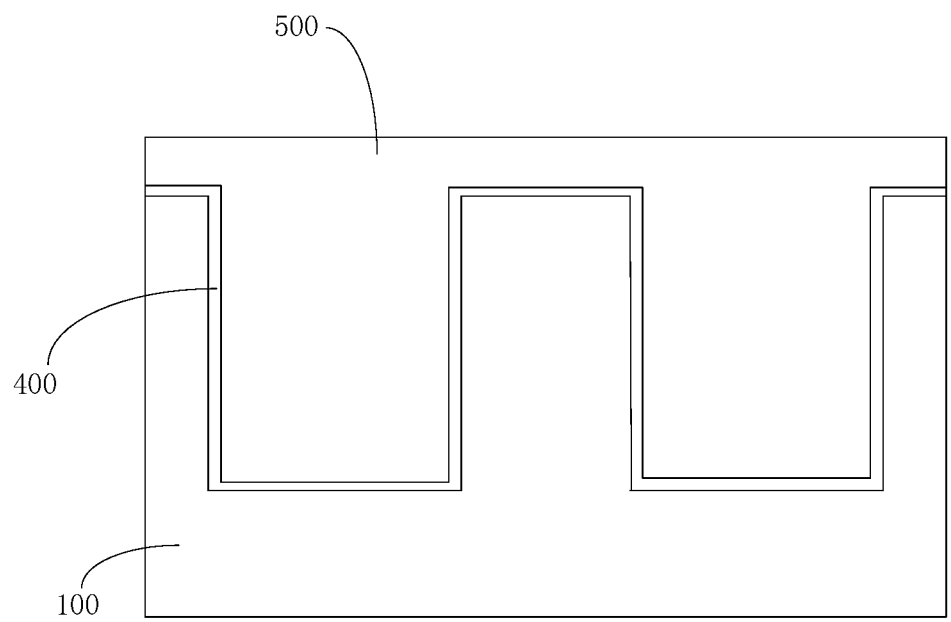
Figure 13:
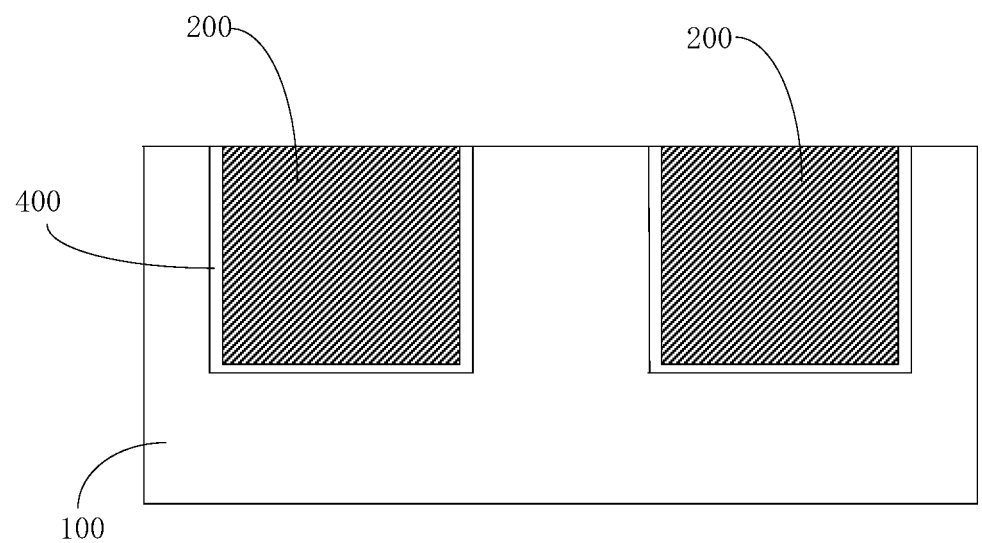

A semiconductor device manufacturing method according to an embodiment of the present application is described below in detail with reference to FIG. 7 to FIG. 13. FIG. 7 to FIG. 13 are sectional views of different process stages of a semiconductor device manufacturing method according to an embodiment of the present application, wherein FIG. 7 to FIG. 11 are sectional views taken along A-A in FIG. 2, and FIG. 12 and FIG. 13 are sectional views taken along B-B in FIG. 5.

Figure 7:
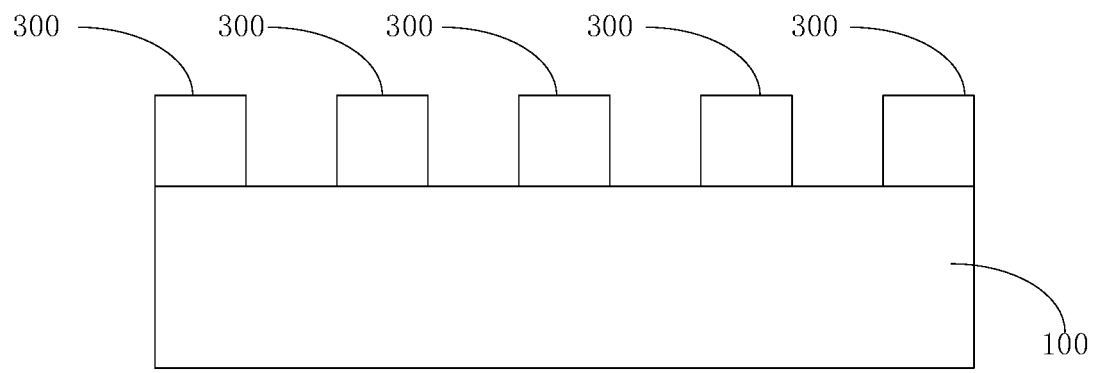

As shown in FIG. 7, a semiconductor substrate 100 having an integrated circuit region 110 is provided, and one or more trenches 120 are formed on the semiconductor substrate 100, wherein the trenches 120 are arranged around the integrated circuit region 110.

In one implementation, the semiconductor substrate 100 may include a semiconductor material such as matrix silicon or monocrystalline silicon. In other embodiments or additional embodiments, the semiconductor substrate 100 may include another semiconductor element such as germanium with a crystalline structure. The semiconductor substrate 100 may also include a semiconductor compound such as silicon-germanium, silicon carbide, gallium arsenide, gallium phosphide, indium phosphide, indium arsenide, indium antimonide, or combinations thereof. The semiconductor substrate 100 may also include a semiconductor-on-insulator substrate such as a silicon-on-insulator substrate, a silicon-germanium-on-insulator substrate, or a germanium-on-insulator substrate.

In some embodiments, the semiconductor substrate 100 is a bulk semiconductor substrate, such as a semiconductor wafer. For example, the semiconductor substrate 100 includes silicon or other elemental semiconductor materials such as germanium. The semiconductor substrate 100 may be doped (e.g., P-type, N-type, or a combinations thereof) or undoped. In some embodiments, the semiconductor substrate 100 includes a semiconductor layer epitaxially grown on a dielectric layer. The semiconductor layer epitaxially grown may be made of silicon germanium, silicon, germanium, one or more other suitable materials or combinations thereof.

In some other embodiments, the semiconductor substrate 100 includes a compound semiconductor. For example, the compound semiconductor includes one or more III-V compound semiconductors and has compositions defined by a formula AlX1GaX2InX3AsY1PY2NY3SbY4. X1, X2, X3, Y1, Y2, Y3 and Y4 represent relative proportions. Each of them is greater than or equal to 0, and all of them are added up to 1. The compound semiconductor may include silicon carbide, gallium arsenide, indium arsenide, indium phosphide, one or more other suitable compound semiconductors, or combinations thereof. Other suitable substrates including II-VI compound semiconductors may also be used.

In some embodiments, the semiconductor substrate 100 is an active layer of a semiconductor-on-insulator (SOI) substrate. The semiconductor-on-insulator substrate may be manufactured using a separation by implantation of oxygen (SIMOX) process, a wafer bonding process, other suitable processes or combinations thereof. In some other embodiments, the semiconductor substrate 100 includes a multilayer structure. For example, the semiconductor substrate 100 includes a silicon-germanium layer formed on a bulk silicon layer.

The one or more trenches 120 may be formed by depositing a mask layer 300 on the semiconductor substrate 100, the mask layer 300 defining the one or more trenches 120. In one implementation, the mask layer 300 may be a photoresist.

Figure 8:
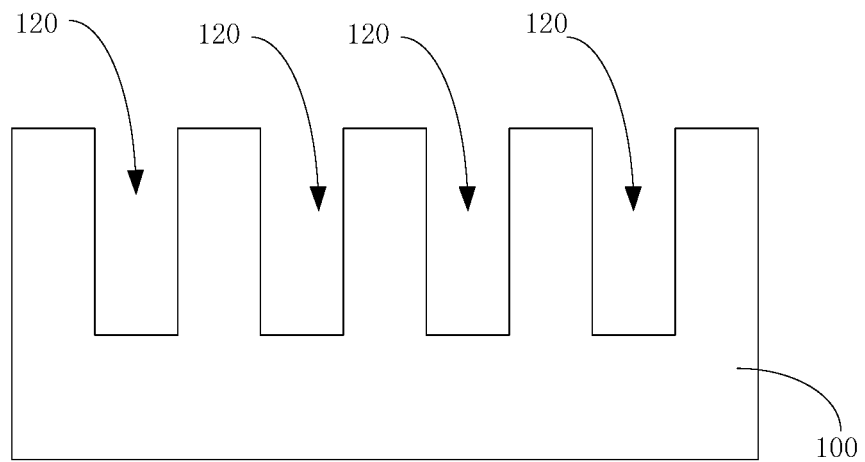

As shown in FIG. 8, after a mask layer 300 is deposited on the semiconductor substrate 100, etching is performed to form the above trenches 120. In one implementation, the etching may be performed using any technology now known or later developed for material removal, which includes, but is not limited to: dry etch process (e.g., plasma etching, plasmon-free gas etching, sputter etching, ion milling or reactive ion etching (RIE); or a wet etching process (e.g., application of acid, alkali, or solvent to dissolve part of the structure, or use of an abrasive formulation to grind away part of the structure).

Figure 9:
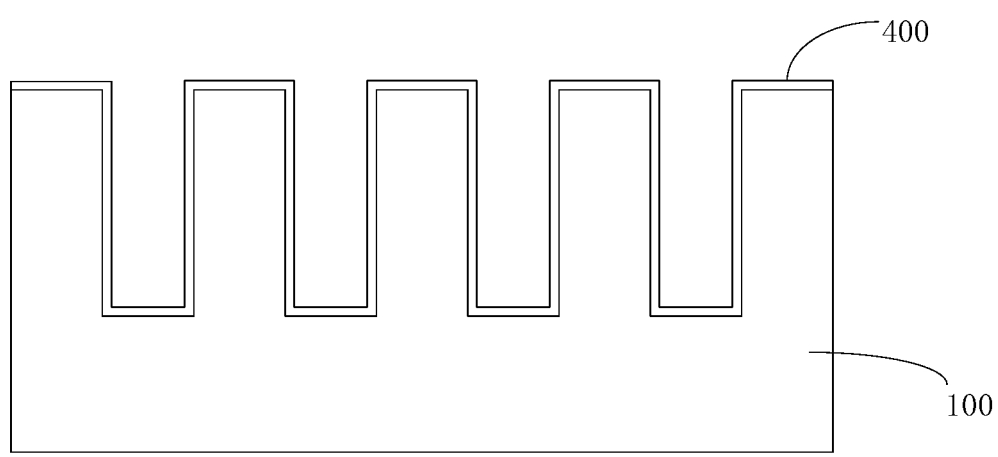

As shown in FIG. 9, after the trench 120 is formed, a barrier layer 400 conformal to a surface of the trench 120 is formed on the surface of the trench 120. In one implementation, the barrier layer 400 may be formed using a chemical vapor deposition process, an atomic layer deposition process, a physical vapor deposition process, a plasma assisted chemical vapor deposition process, an electroplating process, an electroless plating process, a spin coating process, one or more other suitable processes, or combinations thereof.

In one implementation, the barrier layer 400 may include titanium nitride (TiN) or other suitable materials.

Figure 10:
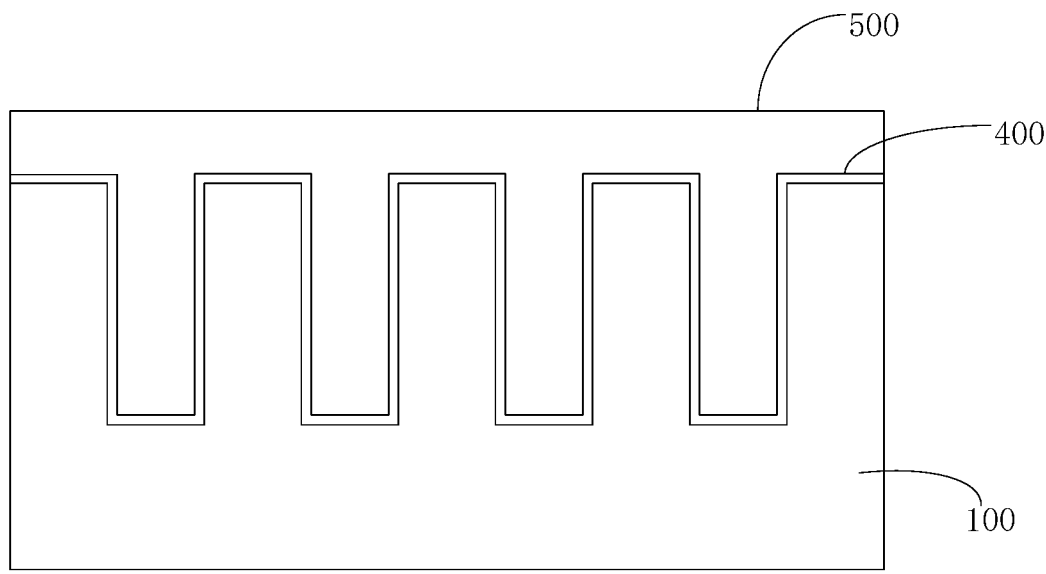

As shown in FIG. 10, after the barrier layer 400 is formed, a metal layer 500 is formed above the barrier layer 400. In one implementation, the metal layer 500 may include tin or aluminum.

In one implementation, the metal layer 500 may be formed using a chemical vapor deposition process, an atomic layer deposition process, a physical vapor deposition process, a plasma assisted chemical vapor deposition process, an electroplating process, an electroless plating process, a spin coating process, one or more other suitable processes, or combinations thereof.

Figure 11:
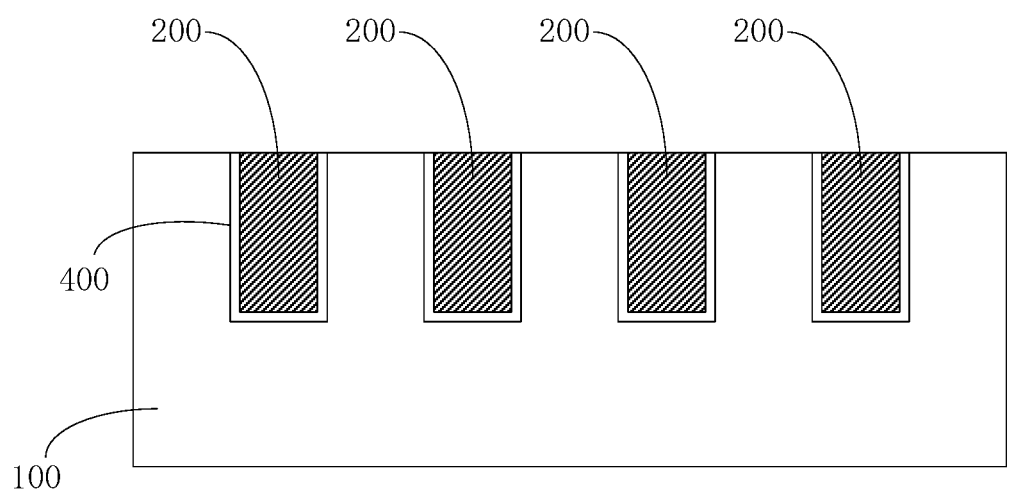

As shown in FIG. 11, after the metal layer 500 is formed, part of the metal layer 500 and part of the barrier layer 400 are removed to form a seal ring 200. In one implementation, the part of the metal layer 500 and the part of the barrier layer 400 may be removed using a chemical mechanical polishing process, a grinding process, an etching process, a dry polishing process, wet cleaning, one or more other suitable processes or combinations thereof.

As shown in FIG. 12 and FIG. 13, FIG. 12 and FIG. 13 are sectional views taken along B-B in FIG. 5. FIG. 12 shows sequential formation of the barrier layer 400 and the metal layer 500 after the trench 120 is formed on the semiconductor substrate 100. FIG. 13 shows the formation of the seal ring 200 after part of the barrier layer 400 and the metal layer 500 are removed. Since two adjacent seal rings 200 at B-B are connected through the fingers 210, only two seal rings 200 are shown on the metal layer 500 formed over the barrier layer 400, which are wider than the seal rings 200 in FIG. 11.

Based on the above, the semiconductor device and the manufacturing method thereof according to the embodiments of the present application have the following advantages and beneficial effects.

The seal ring 200 according to the embodiments of the present application has a wavy structure. The wavy structure enables a surface of the seal ring 200 facing the integrated circuit region 110 and a surface facing away from the integrated circuit region 110 to be arc-shaped. The arc-shaped surface has a larger interception area than a plane, so that the seal ring 200 according to the embodiment of the present application can more effectively prevent entry of moisture and ions into the integrated circuit region 110 and prevent propagation of cracks into the integrated circuit region 110, which significantly improves the protective effect of the seal ring 200.

It should be noted herein that the semiconductor device and the manufacturing method thereof illustrated in the drawings and described in the present specification are only an example of the principles of the present application. Those of ordinary skill in the art should clearly understand that the principles of the present application are not limited to any detail or any component of the device illustrated in the drawings or described in the specification.

It should be understood that the present application does not limit applications thereof to the details of construction and the arrangement of the components set forth in the present specification. The present application can be implemented in other manners and can be implemented and executed in a variety of manners. The foregoing variations and modifications fall within the scope of the present application. It should be understood that the present application disclosed and defined in the present specification extends to all alternative combinations of two or more of the individual features mentioned or evident from the text and/or drawings. All of these different combinations constitute various alternative aspects of the present application. The implementations described in the present specification explain the best modes known for practicing the present application and will enable those skilled in the art to utilize the present application.

What is claimed is:

1. A semiconductor device, comprising:
   a semiconductor substrate;
   an integrated circuit region formed in the semiconductor substrate; and
   a seal ring arranged in the semiconductor substrate and around the integrated circuit region, which configured to protect the integrated circuit region, wherein the seal ring has a wavy structure;
   wherein the seal ring comprises a plurality of crest portions and a plurality of trough portions, the plurality of crest portions and the plurality of trough portions being arranged alternately;
   wherein at least two seal rings are provided, one of two adjacent ones of the seal rings comprises a plurality of fingers, and the finger extends towards a direction of the other seal ring; and
   wherein the plurality of fingers are arranged at vertices of the plurality of crest portions respectively, or the plurality of fingers are arranged at bottom points of the plurality of trough portions respectively.

2. The semiconductor device according to claim 1, wherein the finger is connected to the two adjacent seal rings, so that the at least two adjacent seal rings form a network structure.

3. The semiconductor device according to claim 1, wherein the finger has an arc-shaped surface, the arc-shaped surface face to the other seal ring.

4. The semiconductor device according to claim 1, wherein the semiconductor device further comprises a barrier layer, the barrier layer being arranged between the semiconductor substrate and the seal ring.

5. The semiconductor device according to claim 1, wherein the plurality of crest portions have a same curvature, and the plurality of trough portions have the same curvature.

6. The semiconductor device according to claim 1, wherein
   curvatures between the plurality of crest portions on one of the seal rings are different, and curvatures between the plurality of trough portions are different; or
   curvatures between the plurality of crest portions on one of the seal rings are the same, and curvatures between the plurality of trough portions are the same.

7. The semiconductor device according to claim 1, wherein in two adjacent seal rings, the plurality of crest portions of one of the seal rings are arranged correspondingly to the plurality of trough portions of the other one of the seal rings.

8. A semiconductor device manufacturing method, comprising:
   providing a semiconductor substrate having an integrated circuit region;
   forming a trench on the semiconductor substrate, the trench being arranged around the integrated circuit region; and forming a seal ring in the trench, the seal ring having a wavy structure;

wherein the seal ring comprises a plurality of crest portions and a plurality of trough portions, the plurality of crest portions and the plurality of trough portions being arranged alternately;

wherein at least two seal rings are provided, one of two adjacent ones of the seal rings comprises a plurality of fingers, and the finger extends towards a direction of the other seal ring; and wherein the plurality of fingers are arranged at vertices of the plurality of crest portions respectively, or the plurality of fingers are arranged at bottom points of the plurality of trough portions respectively.

9. The semiconductor device manufacturing method according to claim 8, wherein prior to the forming a seal ring in the trench, the method further comprises:

forming a barrier layer conformal with a surface of the trench.

10. The semiconductor device manufacturing method according to claim 8, wherein the finger is connected to the two adjacent seal rings, so that the at least two adjacent seal rings form a network structure.

11. The semiconductor device manufacturing method according to claim 8, wherein the finger has an arc-shaped surface, the arc-shaped surface facing the other seal ring.

* * * * *